(12) United States Patent
Adlerstein

(10) Patent No.: US 8,441,385 B2
(45) Date of Patent: May 14, 2013

(54) POWER DIGITAL TO ANALOG CONVERTER

(75) Inventor: Michael G. Adlerstein, Wellesley, MA (US)

(73) Assignee: Raytheon Company, Waltham, MA (US)

( * ) Notice: Subject to any disclaimer, the term of this patent is extended or adjusted under 35 U.S.C. 154(b) by 110 days.

(21) Appl. No.: 13/111,059

(22) Filed: May 19, 2011

(65) Prior Publication Data

US 2012/0293352 A1 Nov. 22, 2012

(51) Int. Cl.
*H03M 1/66* (2006.01)
(52) U.S. Cl.
USPC .......................................... 341/144; 341/139
(58) Field of Classification Search .................. 341/139, 341/138, 144, 136
See application file for complete search history.

(56) References Cited

U.S. PATENT DOCUMENTS

| | | | | |
|---|---|---|---|---|
| 4,737,733 A | * | 4/1988 | LaPrade | 330/277 |
| 5,977,843 A | * | 11/1999 | Watanabe | 333/127 |
| 6,054,906 A | * | 4/2000 | Kim | 333/124 |
| 6,400,236 B1 | * | 6/2002 | Ketonen | 333/127 |
| 7,944,382 B2 | * | 5/2011 | Mateman | 341/139 |

* cited by examiner

*Primary Examiner* — Brian Young
(74) *Attorney, Agent, or Firm* — Daly, Crowley, Mofford & Durkee, LLP

(57) ABSTRACT

A digital to analog converter having a plurality of power dividers interconnected into a binary tree configuration, each one having an input and a pair of electrically isolated outputs for dividing power of an input signal at the input equally between the pair of outputs. A plurality of amplifiers is coupled between one of the pair of outputs of the one of the power dividers in one stage of the tree and the input of one of the power dividers in a succeeding stage of the tree. A power combiner is coupled between outputs of the amplifiers in a last one of the stages and an output of the analog to digital converter.

3 Claims, 3 Drawing Sheets

POWER DIGITAL TO ANALOG CONVERTER

TECHNICAL FIELD

This disclosure relates generally to Power Digital To Analog Converters (PDACs) and more particularly to power digital to analog converters having a wide dynamic range and high efficiency.

BACKGROUND

As is known in the art, for many applications in the microwave bands, Power Digital to Analog (PDAC) Converters with high dynamic range are required. Such converters convert a digital word into a power output. These converters should have high dc to rf conversion efficiency.

SUMMARY

In accordance with the present disclosure, a digital to analog converter is provided having a plurality of power dividers interconnected into a binary tree configuration, each one having an input and a pair of electrically isolated outputs for dividing power of an input signal at the input equally between the pair of outputs. A plurality of amplifiers having identical gain and power handling characteristics is coupled between one of the pair of outputs of the one of the power dividers in one stage of the tree and the input of one of the power dividers in a succeeding stage of the tree. A power combiner is coupled between outputs of the amplifiers in a last one of the stages and an output of the analog to digital converter.

In one embodiment, a thermometer code generator is provided for producing a set of binary signal, each set providing a binary signal for each of the amplifiers coupled to the outputs of the power dividers in a corresponding stage of the tree, such binary signal biasing the amplifiers to a selected one of a plurality of gain and power states.

In one embodiment, a digital to analog converter is provided having a plurality of power dividers; each one having an input and a pair of electrically isolated outputs for dividing power of an input signal at the input equally between the pair of outputs. A plurality of amplifiers having identical gain and power handling characteristics is interconnected into a binary tree configuration with the plurality of power dividers, each one of the power dividers being coupled between an output of the amplifier in one stage of the tree and inputs of a pair of the amplifiers in a succeeding stage of the tree. A first one of the power dividers is coupled between an input to the analog to digital converter and the amplifiers in a first one of the stages. A power combiner is coupled between outputs of the amplifiers in a last one of the stages and an output of the analog to digital converter. A thermometer code generator is provided for producing a binary signal for each the amplifiers in each stage of the tree, such binary signal biasing the amplifiers in said stage to a selected one of a plurality of gain-power states.

In one embodiment, digital to analog converter is provided having a plurality of amplifiers having identical gain and power handling characteristics. A plurality of M is successively coupled stages, such one of such stages having $2^M$ of the amplifiers, where M is an different successively increasing integer for each of the successively coupled stages. A plurality of power dividers, each one having an input and a pair of electrically isolated outputs is provided for dividing power of an input signal at the input equally between the pair of outputs, each one of the stages having $2^{M-1}$ of the power dividers, each one of the power dividers in each one of the stages having the outputs thereof coupled to inputs of a different pair of the amplifiers in said one of the stages, inputs of the power dividers being coupled to outputs of the different amplifiers in a preceding one of the stages. A power combiner is coupled between outputs of the amplifiers in a last one of the stages and an output of the analog to digital converter. A thermometer code generator is provided for producing M binary signals, each one of the M binary signals providing a common binary signal for each the amplifiers in a corresponding one of the M, such binary signal biasing the amplifiers in said corresponding one of the stage to a selected one of a pair of gain states.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
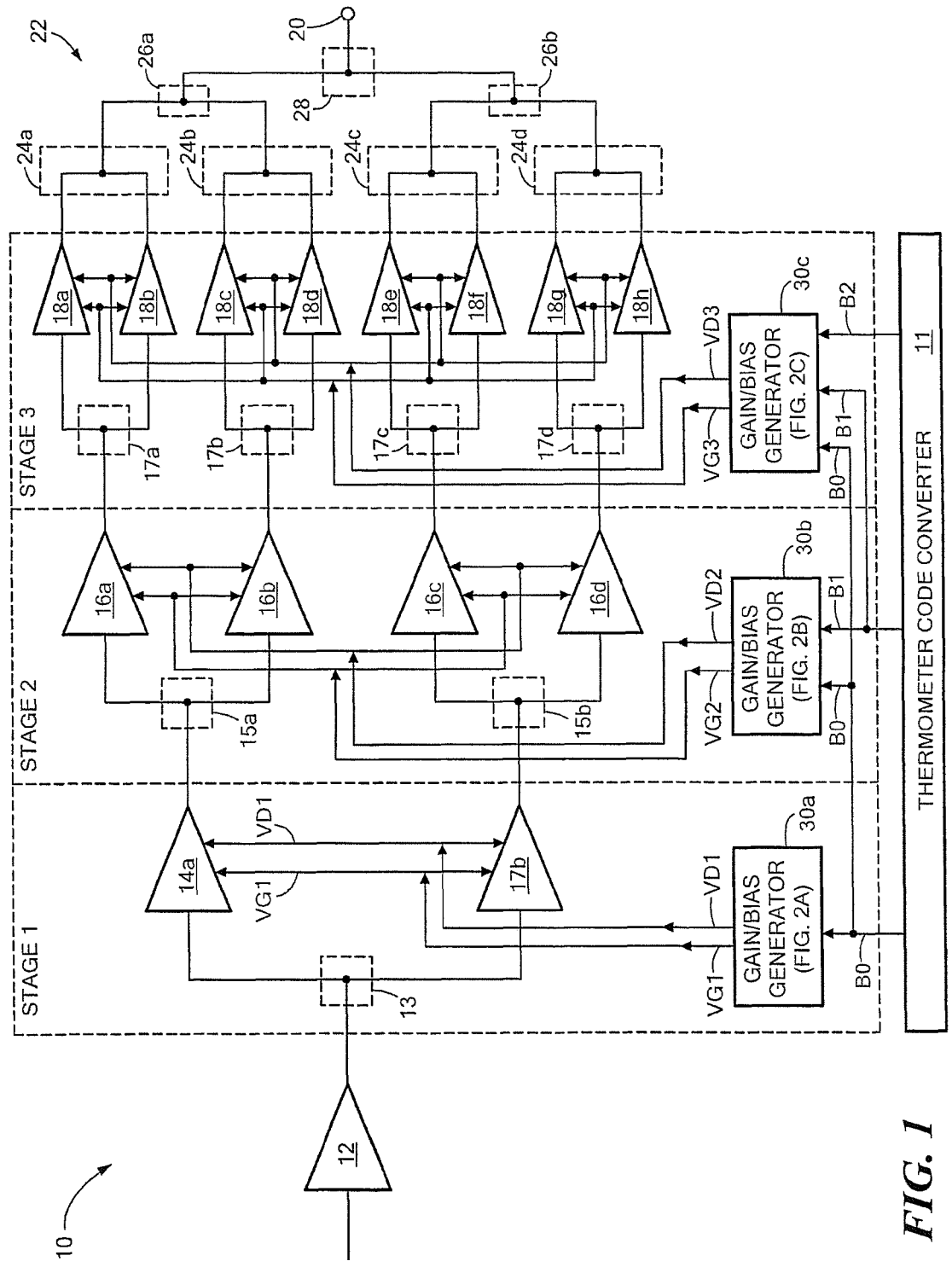
FIG. 1 is a block diagram of a digital to analog converter according to the disclosure.

Referring now to FIG. 1, a digital to analog converter 10 is shown to include a plurality of, here for example three, serially coupled amplifier stages indicated therein as STAGE 1, STAGE 2 and STAGE 3, each stage being responsive to a corresponding bit of a three bit thermometer code B0, B1 and B2, respectively, as indicated. A thermometer code generator 11 is provided for producing a set of binary signal, each set providing a binary signal for the amplifier stages STAGE 1, STAGE 2 and STAGE 3, respectively, in a manner to be described.

More particularly, the power gain of the converter 10 to an RF input signal fed to the converter 10 by an RF driver 12 as a function of the three-bit code is shown in the following table:

| B2 | B1 | B0 | GAIN STAGE 1 (db) | GAIN STAGE 2 (db) | GAIN STAGE 3 (db) | TOTAL GAIN CONVERTER 10 (db) |
|---|---|---|---|---|---|---|
| 0 | 0 | 0 | 0 | 0 | 0 | 0 |
| 0 | 0 | 1 | 3 | 0 | 0 | 3 |
| 0 | 1 | 1 | 3 | 3 | 0 | 6 |
| 1 | 1 | 1 | 3 | 3 | 3 | 9 |

STAGE 1 includes a pair of amplifiers 14a, 14b coupled to the output of the driver 12 through a 2:1 power divider 13. Thus, each one of the amplifiers 14a, 14b receives one half of the power from the driver 12.

STAGE 2 includes two pairs of amplifiers 16a, 16b, 16c and 16d: One pair, here amplifiers 16a and 16b being coupled to the output of amplifier 14a through a 2:1 power divider 15a and the other pair, here amplifiers 14c and 14d being coupled to the output of amplifier 14b through a 2:1 power divider 15b, as indicated. Thus, each one of the amplifiers 16a, 16b receives half the power from amplifier 14a and each one of the amplifiers 16c, 16d receives half the power from amplifier 14b.

STAGE 3 includes four pairs of amplifiers 18a, 18b 18c, 18d, 18e, 18f, 18g and 18h. One pair, here amplifiers 18a and 18b being coupled to amplifier 16a through a 2:1 power divider 17a, a second pair, here amplifiers 18c and 18d being coupled to amplifier 16a through a 2:1 power divider 17b, a third pair, here amplifiers 18e and 18f being coupled to amplifier 16c through a 2:1 power divider 17c, and a fourth pair, here amplifiers 18g and 18h being coupled to amplifier 16d through a 2:1 power divider 17d, as indicated. Thus, each one of the amplifiers 18a, 18b receives half the power from amplifier 16a, each one of the amplifiers 18c, 18d receives half the power from amplifier 16b, each one of the amplifiers 18e, 18f receives half the power from amplifier 16c, and each one of the amplifiers 18g, 18h receives half the power from amplifier 16d.

The outputs of the amplifiers 18a, 18b 18c, 18d, 18e, 18f, 18g and 18h are coupled to an output port 20 through a power combiner section 22, as indicated. More particularly, power combiner section 22 induces three serially coupled combiner stages: the first stage includes four 2:1 power combiners 24a, 24b, 24c and 24d; the second stage includes two 2:1 power combiners 26a and 26b and the third stage includes 2:1 power combiner 28. Power combiner 24a is coupled to the outputs of amplifiers 18a and 18b, power combiner 24b is coupled to the outputs of amplifiers 18c and 18d, power combiner 24c is coupled to the outputs of amplifiers 18e and 18f and power combiner 24d is coupled to the outputs of amplifiers 18g and 18g. Power combiner 26a is coupled to the outputs of power combiner 24a and 24b and power combiner 26b is coupled to the outputs of power combiners 24c and 24d. Power combiner 28 is coupled to the outputs of power combiners 26a and 26b, indicated. The output of power combiner 28 provides the output port 20. The power combiners have a high degree of isolation between their outputs and are here, for example, Wilkinson or Lange power combiners.

Figure 2A:
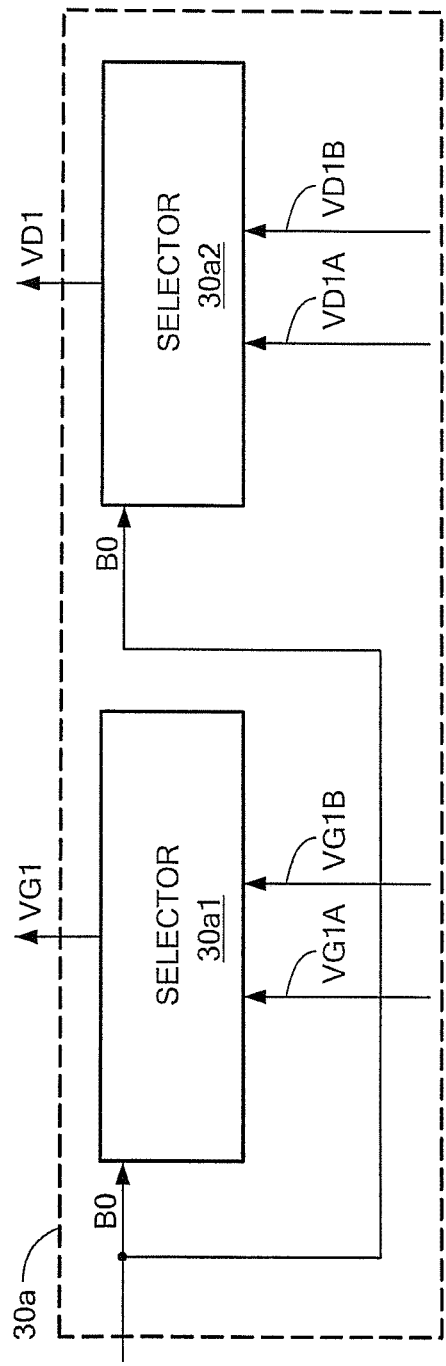
FIGS. 2A, 2B and 2C are block diagrams of a gain/bias generators used in the analog to digital converter of FIG. 1.
Figure 3:
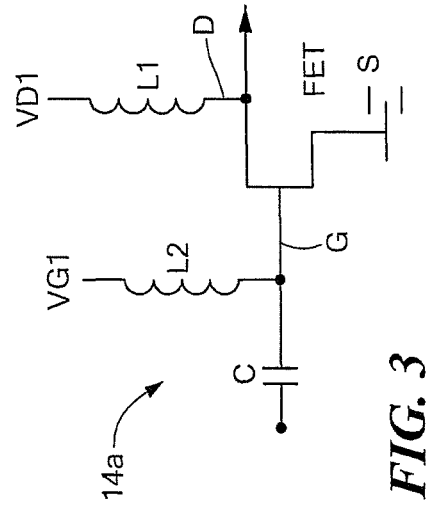
FIG. 3 is exemplary one of a plurality of amplifiers used in the analog to digital converter of FIG. 1

The amplifiers in all the stages (i.e., amplifiers 14a-14b, 16a-16d and 18a-18h) are identical in construction. Considering the amplifiers 14a in STAGE 1, an exemplary one of the amplifiers, here amplifier 14a is shown in FIG. 3. Here the amplifier 14a is a FET amplifier; however, bipolar amplifiers may be used. Further, other configurations may be used. The amplifier 14a in FIG. 3 includes a Field Effect Transistor (FET) having a grounded source (S) and a drain (D) connected to a drain voltage VD1 through an inductor L1 and provides the output of the amplifier 14a, as indicated. The gate (G) is coupled to the input of the amplifier 14a through a dc blocking capacitor (C) and to a gate through an inductor L2, as indicated. In general, the gate and drain bias voltages provided to each amplifier in the tree are functions of the following two variables: (1) the input power provided to the amplifier and (2) the desired output power from the amplifier. These states are selected by the digital input. The resulting gate and drain bias voltages result in the needed gain and high efficiency at the designated power levels. For example, the gate voltage VG1 is here a selected as one of two levels: When the gate voltage VG1 is at a level VG1A, the power gain of the amplifier 14a is 0 db and when the gate voltage VG1 is at a level VG1B, the power gain of the amplifier 14a is 3 db. The voltage at VD1 is selected so that the amplifier 16a operates with maximum efficiency at each one of the two gain levels. Thus, when amplifier 14a is operating to provide a power gain of 0 db, the drain, or FET bias voltage, VD1 is selected to be at a level VD1A and when the amplifier 16a is operating to provide a power gain of 3 db, the drain voltage VD1 is selected to be at a level VD1B. These levels VGA1, VGA2, VDB1 and VDB2 are established during the design phase of the amplifier 14a. As noted above, the amplifier 14b is identical to amplifier 16a and hence it will be fed the same gate and drain voltages as amplifier 14a as indicated in FIG. 1. The voltages VG1 and VD1 are provided to both amplifiers 14a and 14b so that when voltages VG1A are provided to both amplifiers 14a and 14b each provides a gain of 1 and therefore the total gain of STAGE 1 is 0 db; whereas when voltages VG1B and VDB1 are provided to both amplifiers 14a and 14b each provides a gain of 2.0 and therefore the total gain of STAGE 1 is 3 db. The voltages VGA1, VGA2, VDA1 and VDA2 are provided by a gain/bias generator 30a (FIG. 1), such generator 30a being shown in more detail in FIG. 2A.

More particularly, the gain/bias generator 30a (FIG. 2A) includes a pair of selectors 30a1, 30a2. Selector 30a1 has inputs of the voltages VG1A, VG1B and output VG1. One of the voltages VG1A, VG1B is selectively coupled to the output in accordance with the bit B0 provided by the thermometer generator 11. Thus, here VG1A is selected when bit B0 is logic 0 and VG1B is selected when bit B0 is logic 1. Selector 30a2 operates in a similar manner to couple voltage VD1A as the voltage VD1 when bit B0 is 0 and VD1B when bit B0 is 1.

Figure 2B:
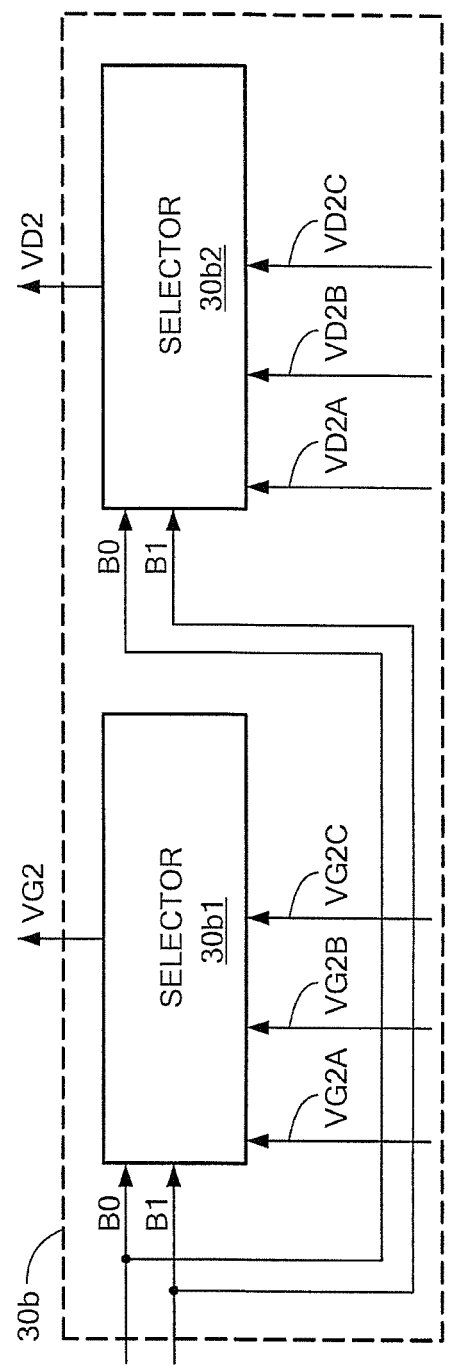

Considering now the amplifiers 16a-16d, here each one of the amplifiers 16a-16d is fed gate and drain voltages VG2 and VD2, respectively, as indicated in FIG. 1. These voltages VG2 and VD2 are established during the design of the amplifiers 16a-16b to enable the amplifiers 16a-16d to produce a selected one of three gate and drain voltages; i.e., a selected one of three gate voltages, VG2A, VG2B, VG2C and a selected one of three drain voltages VD2A, VD2B and VD2C, respectively, such voltages being produced by a gain/bias generator 30b shown in more detail in FIG. 2B. Each one of the three voltages is a function of both the input power level to the amplifiers 16a-16d (which is a function of the gain selected for STAGE 1) and the gain selected for STAGE 2. Thus:

the voltage VG2A is selected as the voltage VG2 when the gain of STAGE 1 is 0 db and the gain selected for STAGE 2 is 0 db with each one of the amplifiers 14a-14d providing a gain of 0 db;

the voltage VG2B is selected as the voltage of VG2 when the gain of STAGE 1 is 3 db and the gain selected for STAGE 2 is 0 db with each one of the amplifiers 14a-14d providing a gain of 0 db; and the voltage VG2C is selected as the voltage of VG2 when the gain of STAGE 1 is 3 db and the gain selected for STAGE 2 is 3 db with each one of the amplifiers 14a-14d providing a gain of 3 db.

Likewise:

the voltage VD2A is selected as the voltage VD2 when the gain of STAGE 1 is 0 db and the gain selected for STAGE 2 is 0 db;

the voltage VD2B is selected as the voltage of VD2 when the gain of STAGE 1 is 3 db and the gain selected for STAGE 2 is 0 db; and the voltage VD2C is selected as the voltage of VD2 when the gain of STAGE 1 is 3 db and the gain selected for STAGE 2 is 3 db.

More particularly, the gain/bias generator 30b (FIG. 2B) includes a pair of selectors 30b1, 30b2. Selector 30b1 has inputs of the voltages VG2A, VG2B and VG2C and output VG2. One of the voltages VG2A, VG2B and VG2C is selectively coupled to the output in accordance with the bits B0 and B1 provided by the thermometer generator 11. Thus, here VG2A is selected when bit B0 is logic 0 and B1 is logic 0; VG2B is selected when bit B1 is logic 0 and bit B0 is logic 1 and VG2C is selected when bit B0 and B1 are both logic 1. Selector 30b2 operates in a similar manner to couple voltage VD2A as the voltage VD2 when bits B0 and B1 are both logic 0; VD2B when bit B0 is 1 and B1 is logic 0 and VD2C when bits B0 and B1 are both logic 1.

Figure 2C:
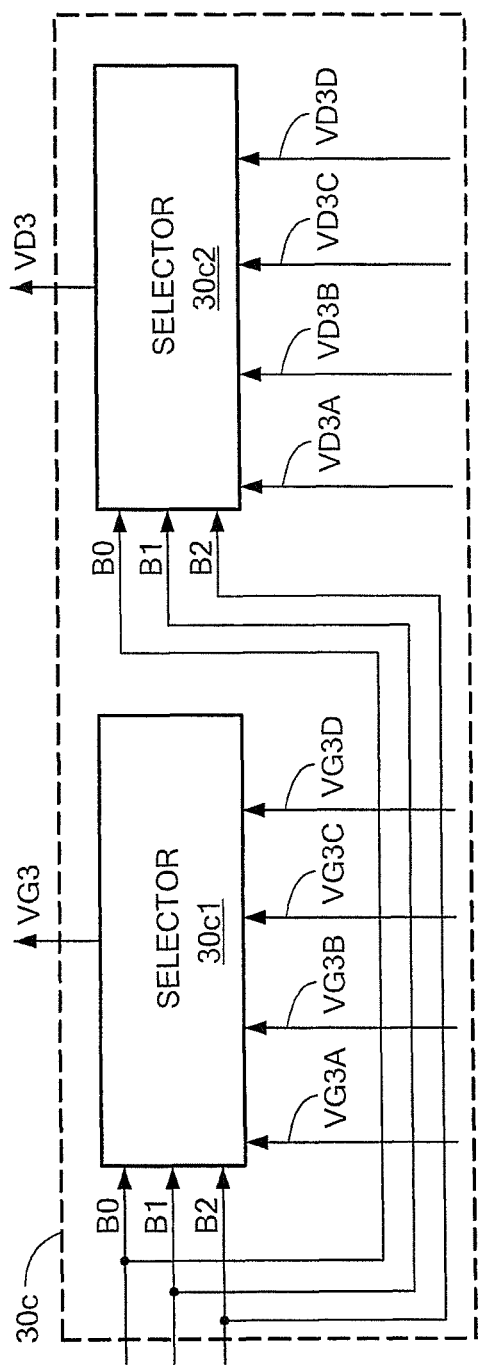

Considering now the amplifiers 18a-18h, here each one of the amplifiers 18a-168h is fed gate and drain voltages VG3 and VD3, respectively, as indicated in FIG. 1. These voltages VG3 and VD3 are established during the design of the amplifiers 16a-16b to enable the amplifiers 16a-16d to produce a selected one of four gate and drain voltages; i.e., a selected one of three gate voltages, VG3A, VG3B, VG3C, and VG4D and a selected one of four drain voltages VD3A, VD3B, VD3C and VD3D, respectively, such voltages being produced by a gain/bias generator 30c shown in more detail in FIG. 2C. Each one of the four voltages is a function of the input power level to the amplifiers 18a-168 (which is a function of the gain selected for STAGE 1 and the gain selected for STAGE 2) and the gain selected for STAGE 3

Thus:
the voltage VG3A is selected as the voltage VG3 when the gain of STAGE 1 is 0 db, the gain selected for STAGE 2 is 0 db and the gain selected for STAGE 3 is 0 db;
the voltage VG3B is selected as the voltage of VG3 when the gain of STAGE 1 is 3 db, the gain selected for STAGE 2 is 0 db, and the gain selected for STAGE 3 is 0 db;
the voltage VG3C is selected as the voltage of VG3 when the gain of STAGE 1 is 3 db and the gain selected for STAGE 2 is 3 db and the gain selected for STAGE 3 is 0 db; and
the voltage VG3D is selected as the voltage of VG3 when the gain of STAGE 1 is 3 db and the gain selected for STAGE 2 is 3 db and the gain selected for STAGE 3 is 3 db.

Likewise:
the voltage VD3A is selected as the voltage VD3 when the gain of STAGE 1 is 0 db, the gain selected for STAGE 2 is 0 db and the gain selected for STAGE 3 is 0 db;
the voltage VD3B is selected as the voltage of VD3 when the gain of STAGE 1 is 3 db, the gain selected for STAGE 2 is 0 db, and the gain selected for STAGE 3 is 0 db;
the voltage VD3C is selected as the voltage of VD3 when the gain of STAGE 1 is 3 db and the gain selected for STAGE 2 is 3 db and the gain selected for STAGE 3 is 0 db; and
the voltage VD3D is selected as the voltage of VD3 when the gain of STAGE 1 is 3 db and the gain selected for STAGE 2 is 3 db and the gain selected for STAGE 3 is 3 db.

More particularly, the gain/bias generator 30c (FIG. 2C) includes a pair of selectors 30c1, 30c2. Selector 301 has inputs of the voltages VG3A, VG3B VG3C and VG3D and output VG3. One of the voltages VG3A, VG3B VG3C and VG3D is selectively coupled to the output in accordance with the bits B0, B1 and B2 provided by the thermometer generator 11. Thus, here VG3A is selected when bits B0, B1 and B2 are logic 0; VG2B is selected when bit B0 is logic 1 and bits B1 and B2 is logic 0; VG3C is selected when bit B0 and B1 are both logic 1 and bit B2 is logic 0 and VG3D is selected when bits B0-B2 are logic 1. Selector 30c2 operates in a similar manner to couple voltage VD3A as the voltage VD3 when bits B0, B1 and B2 are logic 0; VD2B when bit B0 is 1 and bits B1 and B2 are logic 0, VD3C when bits B0 and B1 are both logic 1 and bit B2 is logic 0, and VD3D is selected when all bits B0-B2 are logic 1.

Thus, it is noted that the converter 10 includes a plurality of power dividers interconnected into a binary tree configuration, each one having an input and a pair of electrically isolated outputs for dividing power of an input signal at the input equally between the pair of outputs. The converter 10 includes a plurality of amplifiers having identical gain and power handling characteristics, each one of the amplifiers being coupled between one of the pair of outputs of the one of the power dividers in one stage of the tree and the input of one of the power dividers in a succeeding stage of the tree. A power combiner is coupled between outputs of the amplifiers in a last one of the stages and an output of the analog to digital converter. The thermometer code generator is provided for producing a set of binary signal, each set providing a binary signal for each the amplifiers coupled to the outputs of the power dividers in a corresponding stage of the tree, such binary signal biasing the amplifiers to a selected one of a pair of gain states.

It is to be noted that the 0 db gain is state is nominal in that gain can be increased slightly to offset combiner state losses. In the 0 db state, the amplifiers are in the small signal regime and therefore the bias current can be low. In the 3 dB state, the amplifiers can be operated in saturation, and therefore at high drain efficiency. In design, it would be necessary to maintain reasonable impedance match at both bias states. However, any mismatch could be compensated at the network level.

Numerous variations of this combining arrangement can be implemented by using unit amplifiers of various sizes and various bias options. Such bias options include implementation of digitally controlled envelope tracking to account for differences in drive levels in the stages. Design of the DAC is simplified since only one unit amplifier is used. It can be optimized for bandwidth, bias response time and other characteristics. Thus/a number of embodiments of the disclosure have been described. Nevertheless, it will be understood that various modifications may be made without departing from the spirit and scope of the disclosure. Accordingly, other embodiments are within the scope of the following claims.

What is claimed is:

1. A digital to analog converter, comprising:
a plurality of power dividers interconnected into a binary tree configuration, each one having an input and a pair of electrically isolated outputs for dividing power of an input signal at the input equally between the pair of outputs;
a plurality of amplifiers each one of the amplifiers being coupled between one of the pair of outputs of the one of the power dividers in one stage of the tree and the input of one of the power dividers in a succeeding stage of the tree;
a power combiner coupled between outputs of the amplifiers in a last one of the stages and an output of digital to analog converter; and
a thermometer code generator for producing a set of binary signal, each set providing a binary signal for each the amplifiers coupled to the outputs of the power dividers in a corresponding stage of the tree, such binary signal biasing the amplifiers to a selected one of a pair of gain states.

2. A digital to analog converter, comprising:
a plurality of power dividers, each one having an input and a pair of electrically isolated outputs for dividing power of an input signal at the input equally between the pair of outputs;
a plurality of amplifiers interconnected into a binary tree configuration with the plurality of power dividers, each one of the power dividers being coupled between an output of the amplifier in one stage of the tree and inputs of a pair of the amplifiers in a succeeding stage of the tree;

wherein a first one of the power dividers is coupled between an input to the digital to analog converter and the amplifiers in a first one of the stages;

a power combiner coupled between outputs of the amplifiers in a last one of the stages and an output of the digital to analog converter; and a thermometer code generator for producing a binary signal for each the amplifiers in each stage of the tree, such binary signal biasing the amplifiers in said stage to a selected one of a pair of gain states.

3. A digital to analog converter, comprising:

a plurality of amplifiers;

a plurality of M successively coupled stages, such one of such stages having $2^M$ of the amplifiers, where M is a different successively increasing integer for each of the successively coupled stages;

a plurality of power dividers, each one having an input and a pair of electrically isolated outputs for dividing power of an input signal at the input equally between the pair of outputs, each one of the stages having $2^{M-1}$ of the power dividers, each one of the power dividers in each one of the stages having the outputs thereof coupled to inputs of a different pair of the amplifiers in said one of the stages, inputs of the power dividers being coupled to outputs of the different amplifiers in a preceding one of the stages;

a power combiner coupled between outputs of the amplifiers in a last one of the stages and an output of the digital to analog converter; and a thermometer code generator for producing a M binary signals, each one of the M binary signals providing a common binary signal for each the amplifiers in a corresponding one of the M, such binary signal biasing the amplifiers in said corresponding one of the stage to a selected one of a pair of gain states.

* * * * *